United States Patent [19]

Mielke

[11] Patent Number: 5,220,528
[45] Date of Patent: Jun. 15, 1993

[54] COMPENSATION CIRCUIT FOR LEAKAGE IN FLASH EPROM

[75] Inventor: Neal R. Mielke, Los Altos Hills, Calif.

[73] Assignee: Intel Corporation, Santa Clara, Calif.

[21] Appl. No.: 615,400

[22] Filed: Nov. 19, 1990

[51] Int. Cl.$^5$ ............................................. G11C 11/40
[52] U.S. Cl. ..................................... 365/185; 365/218
[58] Field of Search ................ 365/104, 185, 218, 900

[56] References Cited

U.S. PATENT DOCUMENTS 4,503,524  3/1985  McElroy .............................. 365/185
4,888,734  12/1989  Lee et al. ............................. 365/185

Primary Examiner—Joseph A. Popek
Attorney, Agent, or Firm—Blakely, Sokoloff, Taylor & Zafman

[57] ABSTRACT

An improvement in a memory array using single device floating gate flash memory cells for compensating for drain leakage. Drain leakage can cause hot hole injection during erasing thereby over-erasing a cell causing it to act as a depletion device. The column line is biased during erasing, raising the drain potential sufficiently high to prevent a leakage current path through the channel of the cell. A transistor is coupled to each column line and is selected during erase by a low potential to provide the bias for the drain regions.

6 Claims, 1 Drawing Sheet

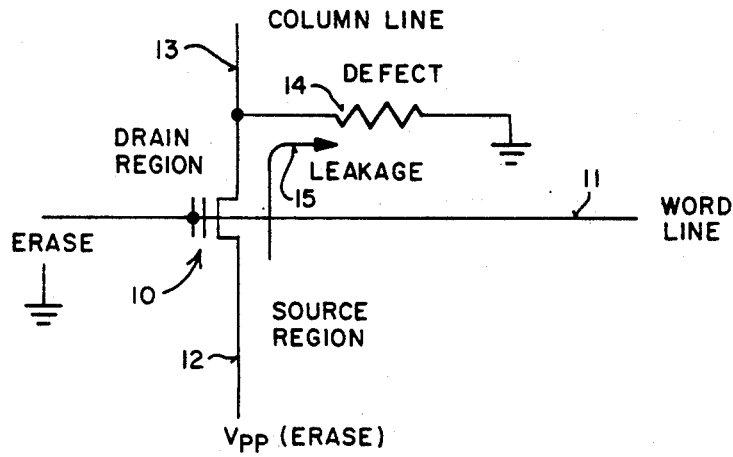
FIG_1 (PRIOR ART)
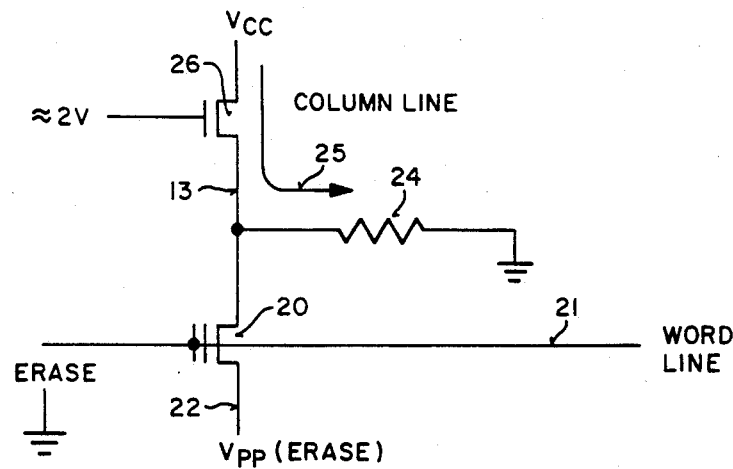
FIG_2
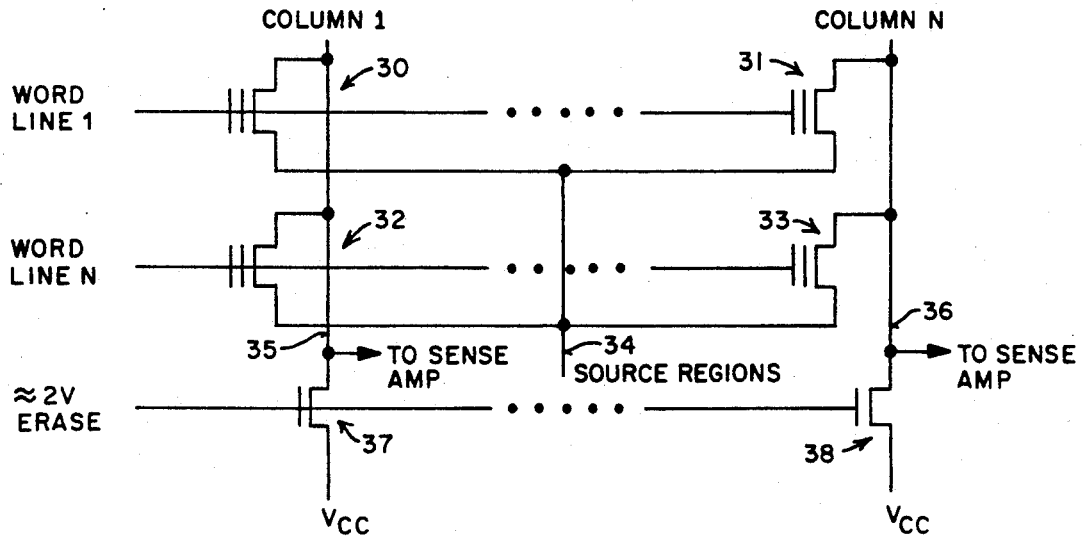
FIG_3

COMPENSATION CIRCUIT FOR LEAKAGE IN FLASH EPROM

BACKGROUND OF THE INVENTION

1. Field of the Invention

The invention relates to the field of electrically programmable and electrically erasable memory cells, particularly those fabricated with metal-oxide-semiconductor (MOS) technology and employing floating gates for storing electrical charge.

2. Prior Art

Fabrication of electrically programmable read-only-memories (EPROMs) utilizing metal-oxide-semiconductor (MOS) technology is well-known in the prior art (see U.S. Pat. Nos. 3,660,819; 4,142,926; 4,114,255; and 4,412,310). These EPROMs employ memory cells utilizing floating gates which are generally formed from polysilicon members completely surrounded by an insulator. Electrical charge is transferred into the floating gates using a variety of mechanisms such as avalanche injection, channel injection, Fowler-Nordheim tunnelling, channel hot electron injection, etc. A variety of phenomena have been used to remove charge from the floating gate, including exposing the memory to ultraviolet radiation. The floating gate is programmed when charge is stored in the floating gate. The cell is in an unprogrammed, or erased, state when the floating gate is discharged. Because of complex and time consuming procedures required to erase EPROMs, these devices have been used primarily in applications requiring read-only-memories.

Electrically programmable and electrically erasable read-only-memories (EEPROMs) were developed to provide the capability of electrically erasing programmed memory cells (see U.S. Pat. Nos. 4,203,138 and 4,099,196). Commercially available EEPROMs generally have used a thin oxide region to transfer the charge into and from a floating gate. In a typical memory, a two transistor cell is used. For instance, U.S. Pat. No. 4,203,158 discloses the fabrication of such an EEPROM cell. Further, U.S. Pat. No. 4,266,283 discloses the arrangement of EEPROMs into an array wherein X and Y select lines provide for the selection, programming and reading of various EEPROM cells. These EEPROM cells do not lend themselves to being reduced in substrate area as do the EPROM cells. Various techniques are disclosed to reduce the size of the memory array by providing higher-density cells. One such technique is disclosed in U.S. Pat. No. 4,432,075.

More recently, a new category of electrically erasable EPROMs/EEPROMs has emerged and these devices are sometimes referred to as "flash" EPROMs or flash EEPROMs. A general discussion of three types of cells used for these flash memories is described in *Electronics* Mar. 3, 1988 "High-Density Flash EEPROMs are About to Burst on the Market" by Robert Lineback. One type of flash memory uses a single device per cell and such cells are described in application Ser. No. 07/253,775 filed Oct. 5, 1988, entitled "Low Voltage EEPROM Cell" (assigned to the assignee of the present invention), which is a continuation application of patent application Ser. No. 892,446, filed Aug. 4, 1986, now abandoned. It is these types of cells that are used in conjunction with the present invention. Also see U.S. Pat. No. 4,868,619 and "A 256-k Bit Flash E²PROM Using Triple-Polysilicon Technology", Masouka, et al., *IEEE Journal of Solid-State Circuits*, Vol SC-22, No. 4, August, 1987.

The single device per cell flash memory cells are programmed by the application of a positive potential (e.g., 4–7 V) to their drain region and a programming potential (e.g., 10–15 V) to their control gate. This causes electrons to be transferred onto the floating gate. During this time the source region is grounded. The cells are erased by application of a positive potential to the source region (e.g., 10–15 V) where the control gate is grounded and the drain region is left floating. This causes the electrons on the floating gate to tunnel through the gate oxide and into the channel and source region.

Care must be taken in erasing these cells to assure that the cell is not over-erased. That is, if too many electrons are removed from the floating gate, the floating gate may become positively charged and the cell will act as a depletion device. Such cells when coupled to a column line, can provide a path to ground even when the cell is not selected for reading and hence, prevent the reading of data from any of the cells along the column line.

As will be described in connection with FIG. 1, over erasing can be caused by a leakage current associated with the drain region of the cell. When this occurs, a "hot hole" erase results causing the cell to be over-erased. The present invention is directed towards compensating for this leakage; the present invention provides a circuit and method allowing cells exhibiting such leakage to be used.

U.S. Pat. No. 4,797,856 describes a method and apparatus for preventing an over-erase condition generally using a feedback arrangement. U.S. Pat. No. 4,860,261 describes a method for verifying drain leakage current.

SUMMARY OF THE PRESENT INVENTION

An improvement in an electrically programmable and electrically erasable memory device having a plurality of memory cells, each of which includes a floating gate for storing electrical charge, a control gate, a source region and a drain region is disclosed. The cells are programmed by application of a positive potential (e.g., 12 V) to the control gate and approximately 5 V to the drain region. Erasing occurs by application of a positive potential (e.g., 12 V) to its source region while the drain region is left floating and the control gate is grounded. The improvement comprises a circuit for applying a positive potential to the drain region during erasing. This positive potential causes a current to flow through the drain region of those devices exhibiting drain leakage. This positive potential prevents a channel current from flowing during erasing and this in turn prevents hot hole injection which can cause an over-erased condition.

BRIEF DESCRIPTION OF THE DRAWINGS

FIG. 1 illustrates a single prior art memory cell and the problem associated with leakage current during erasing the cell.

FIG. 2 illustrates the memory cell of FIG. 1 with the improvement of the present invention.

FIG. 3 is an electrical schematic illustrating a partial memory array with the improvement of the present invention.

DETAILED DESCRIPTION OF THE PRESENT INVENTION

An improvement for compensating for leakage current in a flash memory is described. In the following description, specific details are set forth such as specific voltages in order to provide a thorough understanding of the present invention. It will be obvious to one skilled in the art that the present invention may be practiced without these details. In other instances, well-known circuits, such as decoders, sense amplifiers, etc. have not been described in detail in order not to unnecessarily obscure the present invention.

PROBLEMS WITH A PRIOR ART CELL

Referring first to FIG. 1, a prior art memory cell 10 is illustrated which comprises a control gate, floating gate, and source and drain regions. The drain region is coupled to a memory array column line 13 which is floating during erase. The source region 12 is illustrated coupled to a potential $V_{pp}$ (e.g., 12 V) during an erase operation. The array word line 11 is coupled to the control gate of the cell; this line is coupled to ground during erasing. The construction of the cell is described in co-pending application Ser. No. 07/253,775, filed Oct. 5, 1988 (assigned to the assignee of the present invention), which is a continuation application of patent application Ser. No. 892,446, filed Aug. 4, 1986, now abandoned. Only the erasing of the cell is illustrated since the present invention is used during erasing. The other modes of operation (i.e., programming, reading and writing) operate in the same manner as in the prior art when using the present invention.

Some cells exhibit a leakage current particularly associated with their drain region. This leakage is in the nature of a processing defect. Resistor 14 in FIG. 1 illustrates this leakage. During erasing, when the positive potential is applied to the source region and even with the control gate grounded, a current can flow through the channel of the cell 10 through the parasitic resistance 14. This leakage current is shown by arrow 15 in FIG. 1. When the leakage current flows, the cell is erased too quickly—when compared to other cells not exhibiting leakage. The current causes hot holes to reach the floating gate leaving the gate more positively charged compared to other cells not exhibiting leakage. Typically a plurality of cells are erased at one time and a common erase potential is applied to the source regions of these cells. The duration of this potential is long enough to assure erasing of a typical cell—one not exhibiting leakage. The cell with leakage thus tends to over-erase causing the floating gate to become somewhat positively charged. This phenomena is sometimes referred to hot hole injection or hot hole erasing. Once this occurs, the cell 10 acts like a depletion mode device. Consequently, even when the word line for such cell is de-selected, cell 10 none-the-less conducts preventing the reading of data from other cells along the column line.

IMPROVEMENT OF THE PRESENT INVENTION

Referring to FIG. 2, a cell 20 is illustrated which may be identical to cell 10 of FIG. 1. The control gate of the cell is coupled to an array word line 21 which is grounded during erasing. The source region 22 of cell 20 is coupled to the $V_{pp}$ potential during erasing, as illustrated. The drain region is common with the column line 13 and once again a parasitic resistor 24 is shown to mimic the leakage problem.

With the present invention, a positive potential is applied to the drain region of the cell 20 during erasing. This positive potential is substantially less than the erase potential and is not large enough to disturb the erasing in the cell. In the currently preferred embodiment, this positive potential is obtained by coupling the column line through an enhancement mode field-effect transistor 26 to a voltage source. The potential of 5 V ($V_{cc}$) is used in the current preferred embodiment. The gate of this transistor during erasing is coupled to a potential of approximately 2 V. When this occurs, a current flows through the transistor 26 and parasitic transistor 24 to ground as shown by arrow 25. This current and in particular the potential on the drain region of cell 20 prevents a current from flowing through the channel of the cell 20. It is this current which causes the hot hole injection. Thus, those cells exhibiting leakage do not erase significantly faster than those cells not exhibiting leakage. This prevents the over-erasing condition for those cells having leakage. The potential on the drain regions of those transistors not exhibiting leakage does effect the cells during erasing.

PARTIAL ARRAY OF FIG. 3

In FIG. 3 the present invention is illustrated incorporated into a memory array. Four cells; cells 30, 31, 32 and 33 which are identical to cells 10 and 20 previously described are illustrated. The drain regions of cells 30 and 32 are coupled to a column line 35. Similarly, the drain regions 31 and 33 are coupled to the column line 36. The source regions for all the cells are illustrated coupled to a common line 34. The column line 35 is coupled to $V_{cc}$ through an n-channel transistor 37. And similarly the column line 36 is coupled to $V_{cc}$ (5 V) through an n-channel transistor 38. A potential of approximately 2 V is illustrated being applied to the gates of transistors 37 and 38. Note that this potential is applied to these transistors only during erasing. At other times (for all other memory operations) the gates of these transistors are coupled to ground. This effectively removes the transistors 37 and 38 from the array except during erasing. Note that during reading of data for example, the column lines are coupled to sense amplifiers as is commonly well-known in the art. The partial portion of a memory array in FIG. 3 is fabricated using CMOS technology as is well-known in the art. Other well-known circuits such as pre-charging circuits sometimes coupled to column lines and address decoders used to select column and word lines are not illustrated.

With the present invention 2 V is applied to transistors 37 and 38 and similar transistors only during erasing. This provides the benefit described in conjunction with FIG. 2 and in particular prevents any of the cells in FIG. 3 which exhibit leakage from erasing too quickly.

In the currently preferred embodiment, transistors 37 and 38 are also used during testing of a newly fabricated die for detecting acceptable levels of leakage.

While in FIG. 3 the source regions of the four cells are shown coupled to a common source line, it will be appreciated that in a memory array where predetermined blocks of the array are to be erased as opposed to the entire array, decoding may be used to apply the erase potential to only those source regions which are to be erased. Similarly, it may be desirable to only apply the 2 V to the column lines of the columns which are coupled to transistors selected for erasing.

While the present invention has been described with the currently preferred embodiment of employing transistors 37 and 38 to bias the column lines during erasing, other circuits may be used to bias the column lines during erasing to provide the advantage of the present invention.

I claim:

1. A nonvolatile memory, comprising:
    (A) a memory cell having a drain region, a source region, a floating gate, and a control gate, wherein the memory cell is erased by applying an erasure potential to the source region of the memory cell during erasing; and
    (B) a transistor for applying a positive potential to the drain region of the memory cell during erasing of the memory cell to prevent the memory cell from being over-erased during erasing, wherein the transistor has a first end coupled to the positive potential, a second end coupled to the drain region of the memory cell, a third end selectively coupled to a turn-on potential, wherein the positive potential has a potential level that prevents the memory cell from being over-erased during erasing, wherein the potential level of the positive potential does not disturb the erasing of the memory cell, wherein the potential level of the positive potential is less than that of the erasure potential, wherein when the third end of the transistor receives the turn-on potential during erasing, the transistor couples the positive potential to the drain region of the memory cell, wherein the transistor does not receive the tun-on potential at the third end to couple the positive potential to the drain region of the memory cell during programming of the memory cell.

2. The nonvolatile memory of claim 1, wherein the first end of the transistor is a drain, the second end of the transistor is a source, and the third end of the transistor is a gate.

3. The nonvolatile memory of claim 2, wherein the transistor is an N-channel field effect transistor.

4. The nonvolatile memory of claim 2, wherein the positive potential is approximately 5 volts, wherein the turn-on potential is approximately 2 volts.

5. The nonvolatile memory of claim 2, wherein the memory cell is electrically erasable and electrically programmable.

6. A method of preventing a memory cell in a nonvolatile memory from being over-erased during erasing, wherein the memory cell includes a drain region, a floating gate, a control gate, and a source region, wherein the method comprises the steps of:
    (A) applying a ground potential to the control gate of the memory cell;
    (B) applying an erasure potential to the source region of the memory cell to erase the memory cell during erasing;
    (C) applying a positive potential to the drain region of the memory cell during erasing such that the memory cell is prevented from being over-erased, wherein the positive potential has a potential level that does not disturb the erasing of the memory cell, wherein the potential level of the positive potential is less than that of the erasure potential, wherein the positive potential is not applied to the drain region of the memory cell during programming of the memory cell.

* * * * *